United States Patent
Boucher et al.

(10) Patent No.: US 6,784,366 B1
(45) Date of Patent: Aug. 31, 2004

(54) THERMAL DISSIPATION PACKAGE FOR AN ELECTRICAL SURFACE MOUNT COMPONENT

(75) Inventors: Edmund B. Boucher, Boca Raton, FL (US); Harold M. Cook, Boynton Beach, FL (US); Jose N. Diaz, Pembroke Pines, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/457,914

(22) Filed: Jun. 10, 2003

(51) Int. Cl.$^7$ ................................................. H05K 5/06
(52) U.S. Cl. ..................... 174/52.2; 257/575; 257/713; 361/719
(58) Field of Search .......................... 174/52.1, 52.2, 174/52.4; 257/675, 713; 361/719

(56) References Cited

U.S. PATENT DOCUMENTS

2001/0050429 A1 * 12/2001 Ashdown ..................... 257/706

* cited by examiner

Primary Examiner—Hung V. Ngo
(74) Attorney, Agent, or Firm—Barbara R. Doutre

(57) ABSTRACT

An electronic component (202), such as a power transistor, is formed of a molded plastic package having top (206), bottom (204) and side (208) surfaces and electrical contacts. A lead frame (210) attaches to one of the contacts and wraps about the component (202) so as to provide heat dissipation capability from the bottom and top surfaces of the molded plastic package.

4 Claims, 3 Drawing Sheets

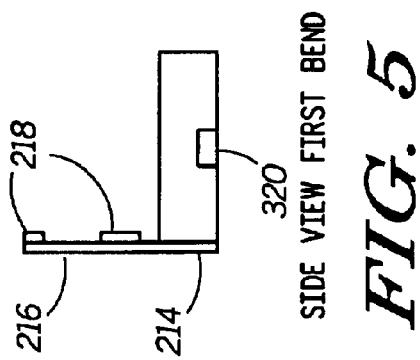
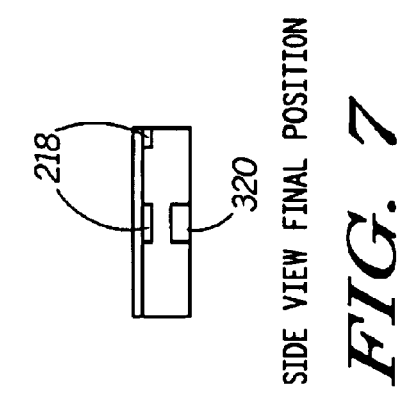
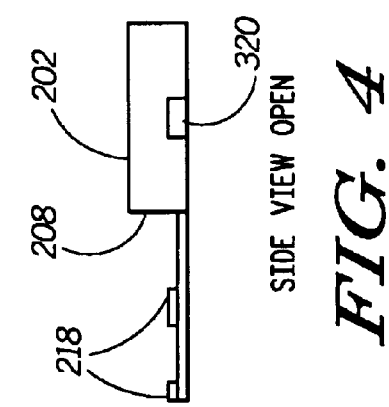
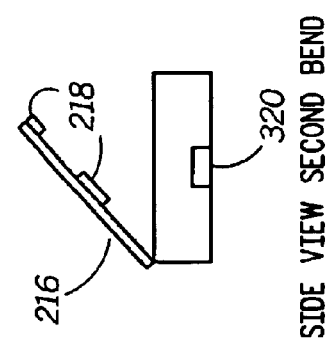
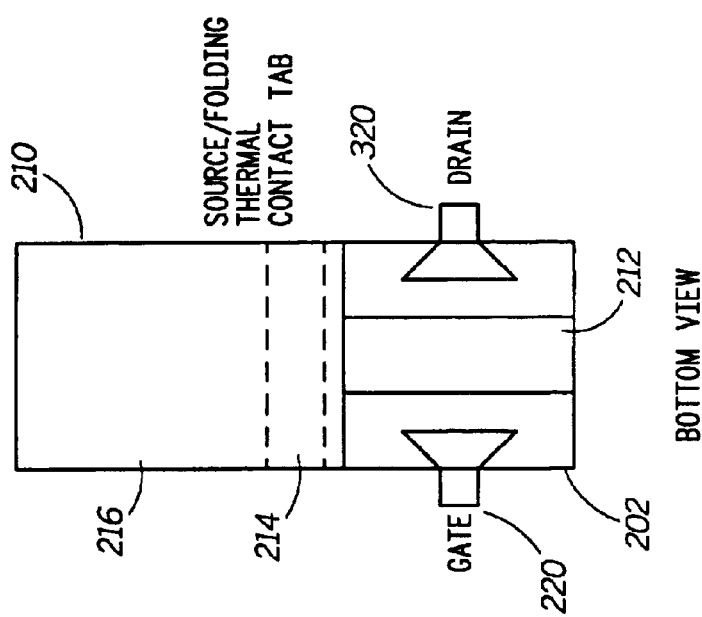

THERMAL DISSIPATION PACKAGE FOR AN ELECTRICAL SURFACE MOUNT COMPONENT

TECHNICAL FIELD

This invention relates in general to electronic surface mount components, and more particularly to the thermal dissipation packaging of such components.

BACKGROUND

Electrical surface mount components facilitate the manufacturing of electronic products. Existing surface mount power transistor packages attempt to combine small size, low cost, and high thermal dissipation. These packages, however, face challenges in providing adequate heat sinking for the active device. Decreases in gain, increases in current drain, and reduced transistor life are all issues when designing high power transistor packages.

FIG. 1 is a bottom view of a prior art field effect transistor (FET) package 100 having drain 102, gate 104 and source 106 contacts formed about a plastic molded package 110. The small size of package 100 is beneficial to cost and electrical performance, but thermal dissipation is severely hampered by the necessity to remove heat from the device. To heat-sink package 100, the source contact 106 is coupled to a bottom metalized surface 108 which provides a ground surface area through which to dissipate heat. When mounted to a printed circuit board (PCB) 802, shown in FIG. 8, metalized surface 108 aligns with solder filled vias 804 and heat spreader 806 to draw heat away from the package 100. Thus, the heat sinking capability of package 100 is limited to the bottom of the device.

There have been attempts to avoid the disadvantages of heat sinking through a PC board, some more successful than others. One attempt turns a traditional leaded surface mount part upside down and folds the electrical connection leads underneath the part to make contact with exposed metal from above. The main disadvantage to this approach, and that of others, is that the leads are so long that significant parasitic inductance affects the electrical performance of the circuit.

Accordingly, a package that would enhance thermal dissipation capability would be highly desirable.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

FIG. 3 is a bottom view of the of the partially assembled thermal dissipation configuration of FIG. 2 in accordance with the present invention;

FIGS. 4–6 show a progression of side view stages for a lead frame being wrapped about a device in accordance with the present invention;

FIG. 7 is a side view of the completed thermal dissipation configuration of FIG. 2 in accordance with the present invention.

DETAILED DESCRIPTION OF THE PREFERRED EMBODIMENT

Figure 2:
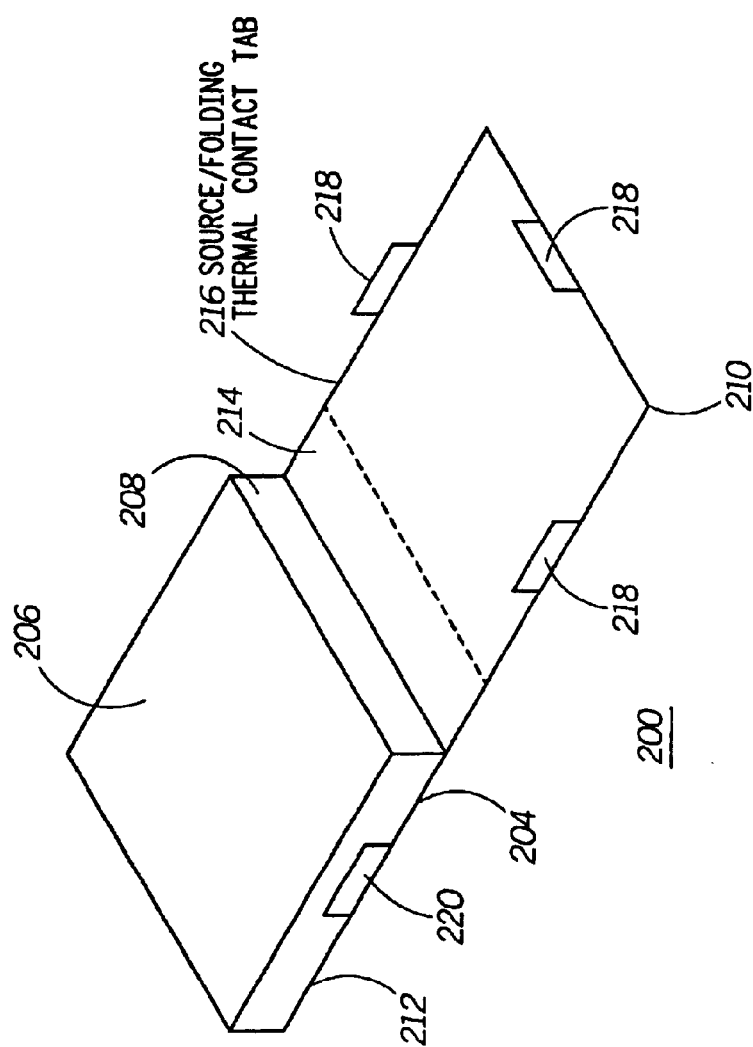
FIG. 2 is a perspective view of a partially assembled thermal dissipation configuration in accordance with the present invention.

While the specification concludes with claims defining the features of the invention that are regarded as novel, it is believed that the invention will be better understood from a consideration of the following description in conjunction with the drawing figures, in which like reference numerals are carried forward.

The thermal dissipation package to be described herein improves heat dissipation in molded plastic packages by utilizing a lead frame configuration which allows the part to dissipate heat through both the top and bottom surfaces of the package.

Turning now to FIG. 2, there is shown a partially assembled thermal dissipation configuration 200 for a surface mount electrical component in accordance with the present invention. Electrical component 202 has bottom, top, and side surfaces 204, 206, 208 respectively. The electrical component 202 includes electrical contacts one of which 220 is shown in this view. In accordance with the present invention and as shown in FIGS. 2 and 3, configuration 200 includes a lead frame 210 having foldable first, second, and third sides 212, 214, 216 respectively for wrapping about the electrical component 202 thereby providing thermal dissipation capability to both the top and bottom surfaces 206, 204 of the electrical component. The entire lead frame 210 of the present invention can be stamped out using existing technology and equipment.

FIG. 3 shows a bottom view of the thermal dissipation configuration of the present invention with the lead frame 210 partially attached. In this view, electrical contacts 220 and 320 are shown on the bottom surface 204 of component 202. Using a field effect transistor (FET) device as an example, contact 220 could be the gate and contact 320 the drain. The first side 212 of the lead frame 210 makes contact to a source contact (not shown) using well known soldering or adhesion techniques. The first side 212 of the lead frame 210 provides a pad for electrical ground, and the third side 216 provides a ground flange for contacting another metal surface. The flange is fashioned out of the lead frame and may include tabs or a lip 218 to snap onto the top of the package when the flange is folded over. The lead frame 210 thus provides a large surface area to which an electrical ground contact gets coupled so that heat can flow from the contact through the flange.

FIGS. 4–6 show various stages of the lead frame 210 being wrapped about the component 202 in accordance with the present invention. FIG. 4 shows a side view of the lead frame 210 wrapped along the bottom surface of the electrical component 202. Electrical contact 320 is shown in this view.

FIG. 5 shows the second side 214 of the lead frame 210 wrapped along side surface 208 of component 202. FIG. 6 shows the third side 216 of the lead frame 210 being folding over toward the top surface 206 of the component 202.

FIG. 7 shows the third side 216 of the lead frame 210 making contact with the top surface 206 of the component 202, thereby providing continuous electrical contact to the bottom, side and top surfaces of the package.

The thermal dissipation configuration of the present invention improves the thermal performance of, for example, a traditional FET power package by extending the source ground/thermal contact area out into a flange which is then folded over the top of the package.

Accordingly, there has been provided an electronic component 202, preferably formed of a molded plastic package, having bottom, side, and surfaces 204, 206, 208, the bottom surface having a ground contact to which a lead frame 210 is coupled and in which the lead frame is wrapped, in accordance with the present invention about the bottom 204, at least one side 208, and the top surfaces 206 of the package.

Figure 1:
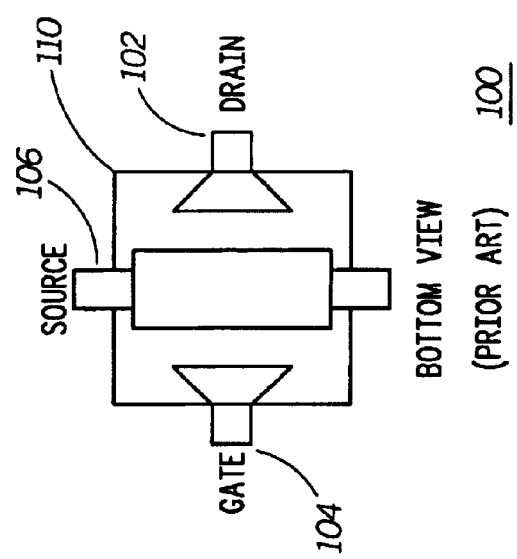
FIG. 1 is a bottom view of a prior art transistor package.
Figure 9:
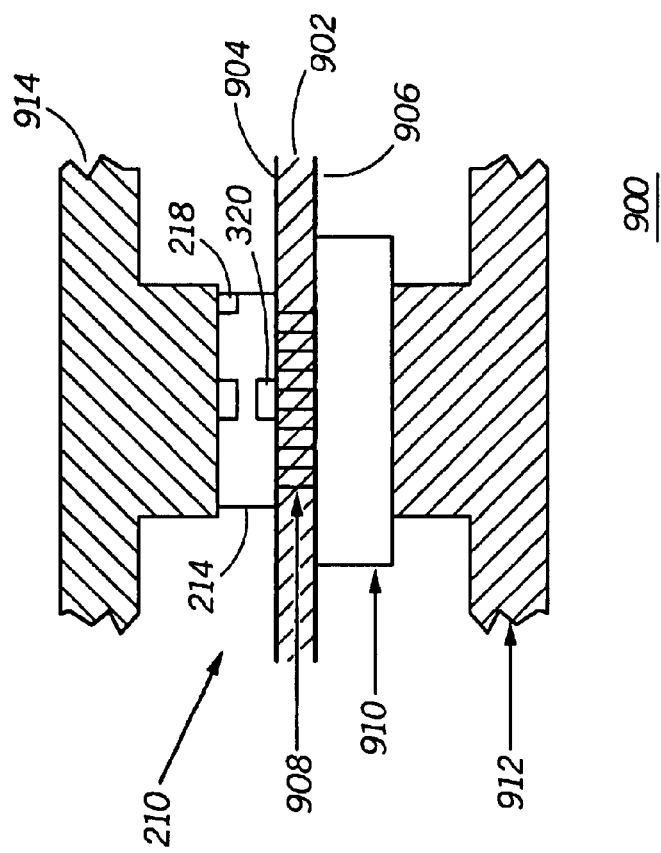
FIGS. 8 and 9 show comparisons of cut-away side views of a heat-sinking assembly of the prior and a thermal dissipation assembly for an electronic component formed in accordance with the present invention respectively.
Figure 8:
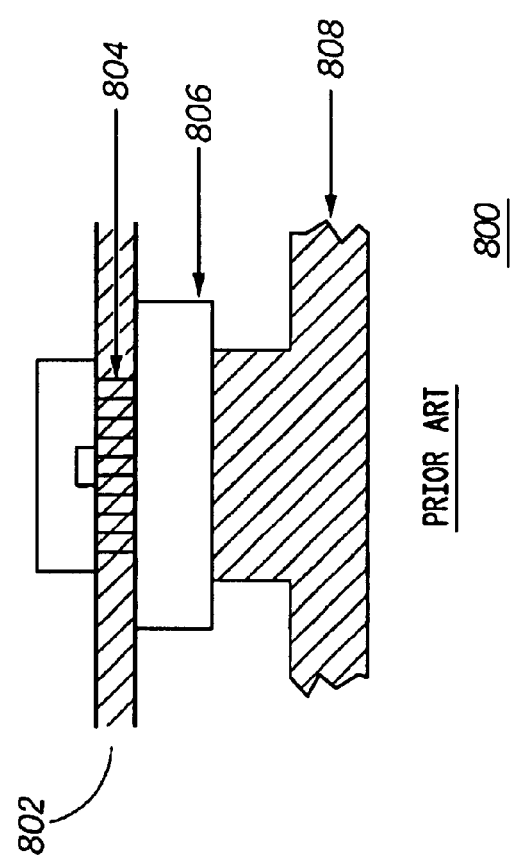

FIGS. 8 and 9 show comparisons of cut-away side views of a heat-sinking assembly 800 of the prior and a thermal dissipation assembly 900 for an electronic component formed in accordance with the present invention. Referring first to FIG. 8, there is shown the prior art package 100 of FIG. 1 with its flange area 108 coupled to a printed circuit board 802 having solder filled via holes 804 formed therein, a heat spreader 806, and a chassis 808. With the flange 108 folded in the previously described manner, the part is soldered down to the printed circuit board 802 and is connected thermally to the board by the solder-filled via holes 804. The solder filled vias contact the heat spreader and the spreader contacts the chassis 808 to provide heat sinking for the part. With the prior art approach 800, heat can only dissipate in one direction, through the vias 804, heat spreader 806, and chassis 808. This is the extent of thermal dissipation capabilities for a traditional power FET package.

FIG. 9 shows a cutaway view of the thermal dissipation assembly for an electronic component formed in accordance with the present invention. Assembly 900 includes a printed circuit board (PCB) 902 having first and second surfaces 904, 906 with solder filled vias 908 formed therebeween. Electrical component 202 has bottom, top, and side surfaces 204, 206, 208 having electrical contacts, one of which is coupled to ground. The thermal dissipation assembly of the present invention includes the lead frame 210 having first, second, and third side surfaces wrapped about the electronic component 202 as described previously. The lead frame 210 couples to the ground contact of the component 202 and also couples to the first surface 904 of the PCB 902, using known soldering techniques, such that the ground contact is aligned over the soldered filled vias 908 of the PCB.

A heat spreader 910 is coupled to the second surface 906 of the PCB 902 and aligned under the solder filled vias 908. A first chassis 912 contacts the metal spreader 910 thereby providing a first path for heat to dissipate from the device. A second chassis 914 makes contact with the third side of the lead frame, thereby providing a second path for thermal dissipation.

Thus, the thermal dissipation assembly 900 of the present invention allows direct chassis contact to be made from the top, as well as the bottom of the device. Heat can now flow through the lead frame from the grounded pad, through the flange and directly into the second chassis 914 in addition to going though solder filled vias 902 and heat spreader 910. The thermal dissipation package of the present invention also allows for design flexibility by enabling that heat-dissipation to occur from the top, the bottom or both the top and bottom of the package.

Accordingly, there has been provided a surface mount electronic component having electrical contacts and a lead frame coupled to at least one of the contacts, the lead frame wrapped about the component so as to provide heat dissipation capability about the bottom and top of the molded plastic package. While shown as a FET transistor with a grounded source contact, depending on the circuit applications, other contacts can be coupled to the lead frame. While the thermal dissipation package of the present invention has been shown as a four sided package, the wrap around lead frame concept of the present invention lends itself to other package shapes, such as circular, oval, and others which can also benefit from the top and bottom thermal dissipation advantages.

The addition of the ground flange (third side 216 of lead frame 210) which allows heat-sinking contact from the top of the package as well as the bottom provides an improvement over known technology. The folded flange allows the heat to be extracted directly from the lead frame ground terminal folded on top instead of relying solely on though-hole vias and heat spreaders on the on the other side of the printed circuit board.

The thermal dissipation package of the present invention provides several advantages for active devices. Mass-produced injection molded power transistor packages can now be formed. These packages have application in numerous electronic environments, for example portable and mobile radio products.

The thermal dissipation package of the present invention can be applied to any package which must dissipate a large amount of heat. An application is a power LDMOS package used in power amplifiers. Mobile radio designs typically have casting contacts available from the top and the bottom, which lend themselves to thermal dissipation from both sides of an active device package.

The thermal dissipation package of the present invention can also be used portable radio products which can be designed to take advantage of the two-side heat sinking. The thermal dissipation package of the present invention allows electrical contacts to be kept as short as possible by soldering the leads directly to the circuit board. The only lead to be wrapped is an extension of the ground contact which is folded over the top of the device to make contact with a metal surface such as a radio chassis, from above.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A thermal dissipation assembly for an electronic component, comprising:
   a printed circuit board (PCB) having first and second surfaces and soldered filled vias formed therebeween;
   an electrical component having a ground contact;
   a thermal dissipation device formed of a lead frame wrapped about the electronic component, the lead frame coupling to both the ground contact and the first surface of the PCB aligned over the soldered filled vias;
   a heat spreader coupled to the second surface of the PCB and aligned under the solder filled vias;
   a first chassis contacting the metal spreader; and
   a second chassis contacting the thermal dissipation device.

2. The thermal dissipation assembly of claim 1, wherein the electronic component is a power transistor.

3. The thermal dissipation assembly of claim 1, wherein the transistor is a field effect transistor (FET).

4. The thermal dissipation assembly of claim 1, wherein the electronic component is formed as part of a molded plastic package.

* * * * *